United States Patent
Hsieh et al.

(10) Patent No.: US 9,643,271 B2
(45) Date of Patent: May 9, 2017

(54) METHOD FOR MAKING SUPPORT STRUCTURE FOR PROBING DEVICE

(71) Applicant: MPI CORPORATION, Chu-Pei, Hsinchu Shien (TW)

(72) Inventors: Kun-Han Hsieh, Chu-Pei (TW); Huo-Kang Hsu, Chu-Pei (TW); Kuan-Chun Chou, Chu-Pei (TW); Tsung-Yi Chen, Chu-Pei (TW); Chung-Tse Lee, Chu-Pei (TW)

(73) Assignee: MPI Corporation, Chu-Pei, Hsinchu Shien (TW)

( * ) Notice: Subject to any disclaimer, the term of this patent is extended or adjusted under 35 U.S.C. 154(b) by 93 days.

(21) Appl. No.: 14/600,934

(22) Filed: Jan. 20, 2015

(65) Prior Publication Data

US 2015/0206850 A1     Jul. 23, 2015

(30) Foreign Application Priority Data

Jan. 20, 2014   (TW) .............................. 103102000 A

(51) Int. Cl.
*B23K 1/00*     (2006.01)
*H01L 23/00*     (2006.01)

(52) U.S. Cl.
CPC ............ *B23K 1/0016* (2013.01); *H01L 24/12* (2013.01); *H01L 24/81* (2013.01)

(58) Field of Classification Search
None
See application file for complete search history.

(56) References Cited

U.S. PATENT DOCUMENTS

| | | | | |
|---|---|---|---|---|
| 5,684,677 A | * | 11/1997 | Uchida | H05K 3/303 174/260 |
| 6,160,412 A | * | 12/2000 | Martel | G01R 1/07371 324/754.07 |
| 6,570,396 B1 | * | 5/2003 | Kister | G01R 1/07357 257/779 |
| 2005/0223543 A1 | * | 10/2005 | Cohen | G01R 1/06716 29/602.1 |

(Continued)

FOREIGN PATENT DOCUMENTS

| | | |
|---|---|---|
| TW | M442506 | 12/2012 |
| TW | 201307851 | 2/2013 |
| TW | M451544 | 4/2013 |

*Primary Examiner* — Devang R Patel
(74) *Attorney, Agent, or Firm* — Muncy, Geissler, Olds & Lowe, P.C.

(57) ABSTRACT

A method for making a support structure for a probing device includes a step of providing a substrate having first internal conductive lines, a carrier having second internal conductive lines and a thickness less than 2 mm for packaging an integrated circuit chip, solder balls, and photoresist support blocks made by lithography in a way that the solder balls and the photoresist support blocks are disposed between the substrate and the carrier, the photoresist support blocks separately arranged from each other, and at least one of the photoresist support blocks is disposed between two adjacent solder balls. The method further includes a step of electrically connecting the first internal conductive lines with the second internal conductive lines respectively by soldering the carrier and the substrate with the solder balls by reflow soldering.

15 Claims, 10 Drawing Sheets

(56) References Cited

U.S. PATENT DOCUMENTS

| 2009/0189620 | A1* | 7/2009 | Audette | G01R 1/0735 |
| | | | | 324/754.18 |
| 2009/0219043 | A1* | 9/2009 | Nakayama | G01R 31/2889 |
| | | | | 324/762.05 |
| 2013/0033283 | A1* | 2/2013 | Wu | G01R 1/07378 |
| | | | | 324/756.03 |

* cited by examiner

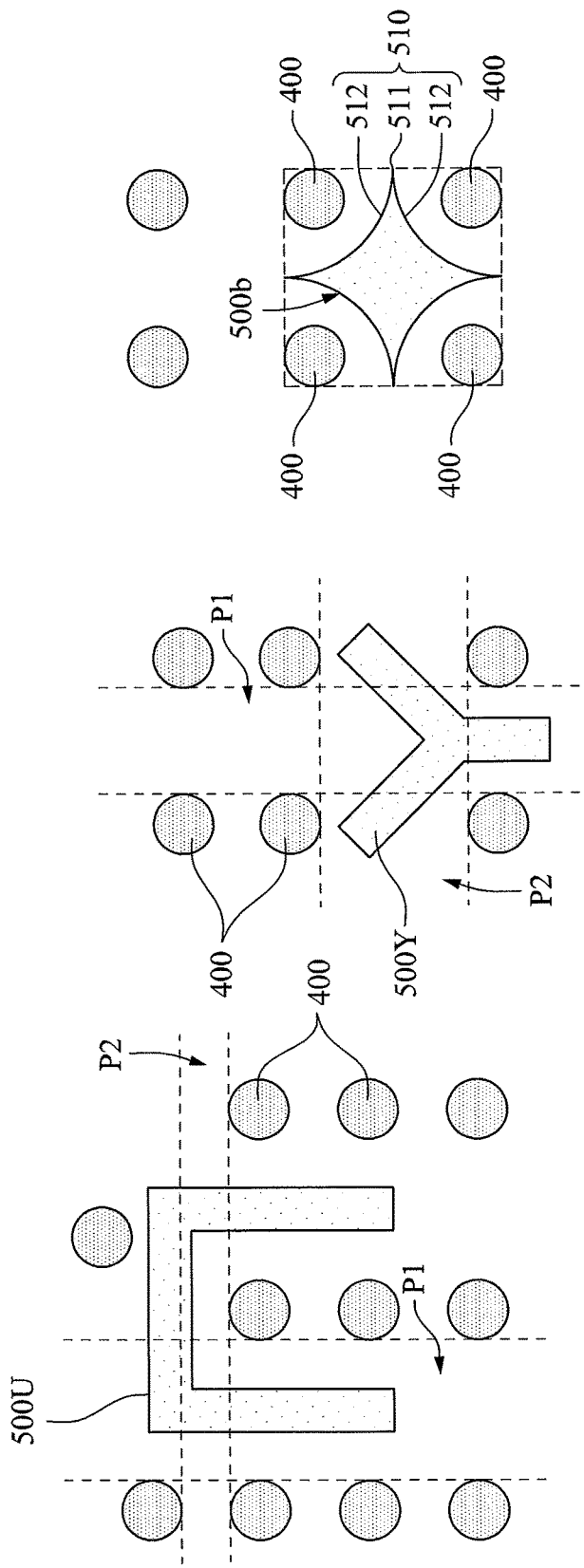

METHOD FOR MAKING SUPPORT STRUCTURE FOR PROBING DEVICE

BACKGROUND OF THE INVENTION

1. Field of the Invention

The present invention relates to a support structure for a probing device and more particularly, to a method for making a support structure for a probing device.

2. Description of the Related Art

It is the market trend to provide a space transformer having a thin thickness for probing device. After several times in IC test, the space transformer may be deformed, or may have dentations therein, leading to poor contact or disconnection between the space transformer and the probes.

Taiwan Patent publication No. 201307851, which is published on Feb. 16, 2013, discloses a probing device (hereinafter referred to as "Prior Art 1). Referring to the appendix FIGS. 1A and 1B, which correspond to FIGS. 2A and 2B of Prior Art 1 respectively, the detailed structure between the reinforcing board and the space transformer of the probing device is shown.

As illustrated in FIG. 1A, the probing device 20 comprises a circuit board 22, a reinforcing board 28, a space transformer 24, and a probe module 26. The circuit board 22, the reinforcing board 28 and the space transformer 24 are stacked up and electrically connected with one another. The probe module 26 comprises a plurality of probes 262. The probe module 26 is mounted on the space transformer 24, and electrically connected with the space transformer 24 and then the circuit board 22. Thus, test signals received by the probes 262 can be transmitted through the space transformer 24 and the reinforcing board 28 to the circuit board 22 for subsequent analysis. When the probing device 20 is operated to conduct a testing task, the probes 262 of the probe module 26 are kept in contact with the device under test (DUT), which is not shown in the drawings. At this time, the device under test imparts a reaction force to the probes 262, causing the probes 262 to exert a force F2 to the space transformer 24 (see FIG. 1B).

Further, as illustrated in FIG. 1B, in order to prevent the space transformer 24 from being deformed by the force F2, the reinforcing board 28 is configured to provide multiple protruding portions 283. The top edges of the protruding portions 283 are stopped against the space transformer 24. Further, every protruding portion 283 defines an accommodation space 282 that accommodates one respective first solder ball 241. Because the space transformer 24 is supported by the protruding portions 283 and the first solder balls 241, the space transformer 24 will not be forced by the force F2 to deform. Further, it is disclosed in Prior Art 1 that the protruding portions 283 may be formed on the space transformer 24, or simultaneously formed on the reinforcing board 28 and the space transformer 24.

The protruding portions 283 recited in Prior Art 1 may be formed by machining. However, Prior Art 1 has drawbacks. A first drawback of Prior Art 1 is that the protruding portions 283 are formed by cutting a thin board member (i.e., the reinforcing board 28 or the space transformer 24, or both of them) into shape. However, because the space transformer provided by manufacturer has a thin thickness, machining the space transformer can cause it to break. A second drawback of Prior Art 1 is that the soldering points of the space transformer 24, which are configured corresponding to the pattern of the contacts of the DUT, are not arranged on one same straight line, and thus, it is difficult to apply a machining process to the thin board in a non-linear manner.

A third drawback of Prior Art 1 is that the protruding portions 283 are disposed in flush with the outer surface of the reinforcing board 28, and thus, it is difficult to discharge the waste gas produced when the solder balls are soldered.

Further, Taiwan Utility Model patent No. M442506, which is published on Dec. 1, 2012, discloses a probing device (hereinafter referred to as "Prior Art 2). As illustrated in the appendix FIG. 2, which corresponds to FIG. 4A of Prior Art 2, a perspective view of a reinforcing board of a probing device of Prior Art 2 is disclosed. As shown in FIG. 2, the reinforcing board of the probing device is configured having a plurality of first gas guiding grooves 286 and a plurality of second gas guiding grooves 288 denoted by the imaginary lines. The first gas guiding grooves 286 and second gas guiding grooves 288 enable the waste gas produced upon soldering of the solder balls to be discharged out of the reinforcing board. Prior Art 2 can eliminate the third drawback of the aforesaid Prior Art 1. However, because the first gas guiding grooves 286 and the second gas guiding grooves 288 are made by machining (milling process), Prior Art 2 still cannot eliminate the aforesaid first and second drawbacks.

Furthermore, Taiwan Utility Model patent No. M451544, which is published on Apr. 21, 2013, discloses a probing device (hereinafter referred to as "Prior Art 3). As illustrated in the appendix FIG. 3, which corresponds to FIG. 3D of Prior Art 3, a buffer block 25 is formed on a space transformer 24 of a probing device of Prior Art 3. This buffer block 25 has four gas guiding grooves 252 formed on the top surface thereof for guiding out produced waste gas in the soldering process. Prior Art 3 can eliminate the third drawback of the aforesaid Prior Art 1. However, because the gas guiding grooves 252 are formed on the buffer block 25 by machining, Prior Art 3 still cannot eliminate the aforesaid first and second drawbacks.

Thus, the probing devices of the aforesaid various prior arts are still not satisfactory in function, and therefore, how to effectively solve the aforesaid problems is one of the important research and development topics, and has also become an object in need of improvement.

SUMMARY OF THE INVENTION

The present invention has been accomplished in view of the above-noted circumstances. It is one objective of the present invention to provide a method for making a support structure for a probing device, which prevents the thin space transformer from being curved by an external force, thereby improving the flatness of the space transformer and prolonging the lifespan thereof.

It is another objective of the present invention to provide a method for making a support structure for probing device, which effectively discharges the produced waste gas upon soldering the solder balls.

To achieve these and other objectives of the present invention, a method for making a support structure for a probing device provided by the present invention comprises the steps of:

a) providing a substrate, a carrier for packaging an integrated circuit chip, a plurality of photoresist support blocks made by lithography, and a plurality of solder balls, wherein the substrate comprises a plurality of first internal conductive lines; the carrier comprises a plurality of second internal conductive lines; the carrier has a thickness less than 2 mm; the photoresist support blocks and the solder balls are disposed between the substrate and the carrier; the photoresist support blocks are separately arranged; at least one of the photoresist support blocks is disposed between two adjacent solder balls; and b) soldering the carrier and the substrate with the solder balls by reflow soldering to electrically connect the first internal conductive lines with the second internal conductive lines respectively.

Other advantages and features of the present invention will be fully understood by reference to the following specification in conjunction with the accompanying drawings, in which like reference signs denote like components of structure.

Further scope of applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

FIGS. 8A-8F illustrate various alternate forms of the photoresist support blocks of the support structure for the probing device in accordance with the present invention.

DETAILED DESCRIPTION OF THE INVENTION

It is to be understood that the drawings disclosed in the present invention are given by way of schematically illustrating the known, common elements and/or structural features of the present invention only; therefore, they are not, or need not to be, sketched according to actual dimension.

In view of the drawbacks of the prior art designs that using a machining method to make protruding portions for support purposes is difficult to process the thin board in a non-linear manner and can easily cause the thin board to break, the present invention employs lithography to form a photoresist on a thin board in a predetermined pattern, and thus support blocks can be pre-formed on a thin board (such as space transformer), preventing deformation of the thin board upon receiving a force. Further, the present invention does not need to create gas guiding grooves, and produced waste gas during soldering of the solder balls can be effectively discharged.

Embodiment I

Figure 1A:
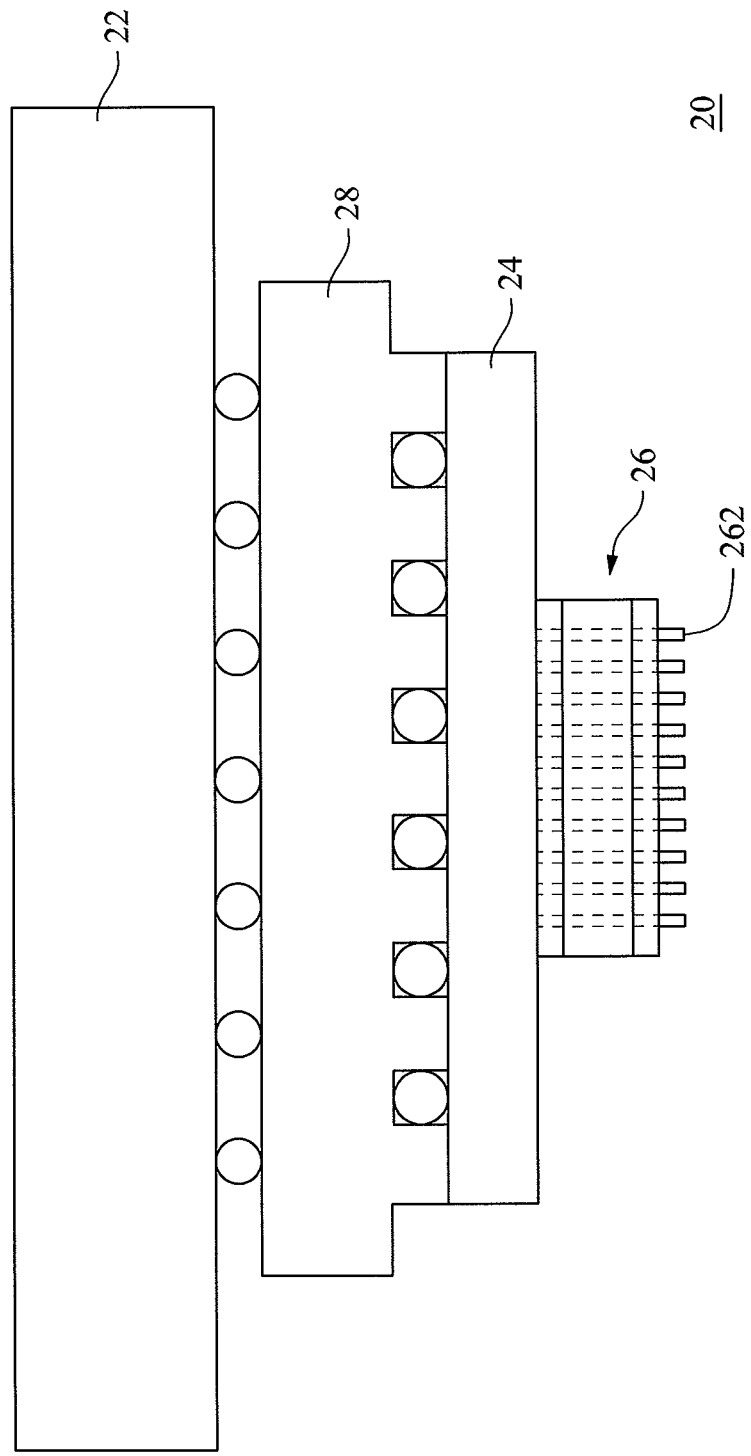
FIG. 1A illustrates a probing device according to Prior Art 1.
Figure 1B:
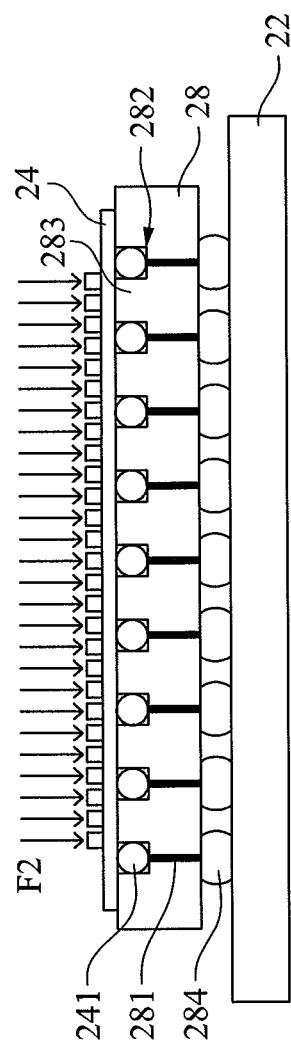
FIG. 1B illustrates the structure between the reinforcing board and the space transformer of the probing device shown in FIG. 1A.
Figure 2:
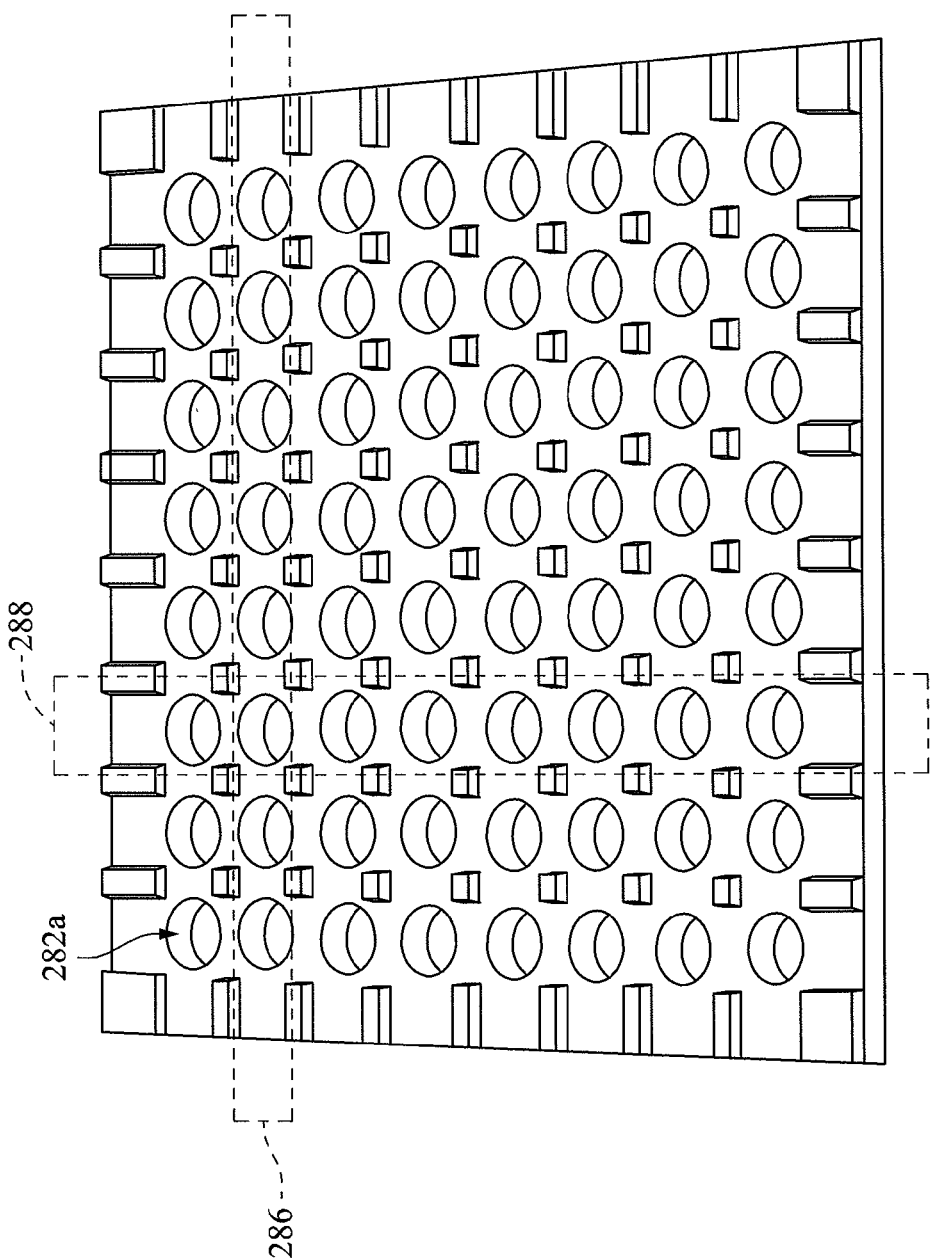
FIG. 2 is a perspective view of a reinforcing board of a probing device according to Prior Art 2.
Figure 3:
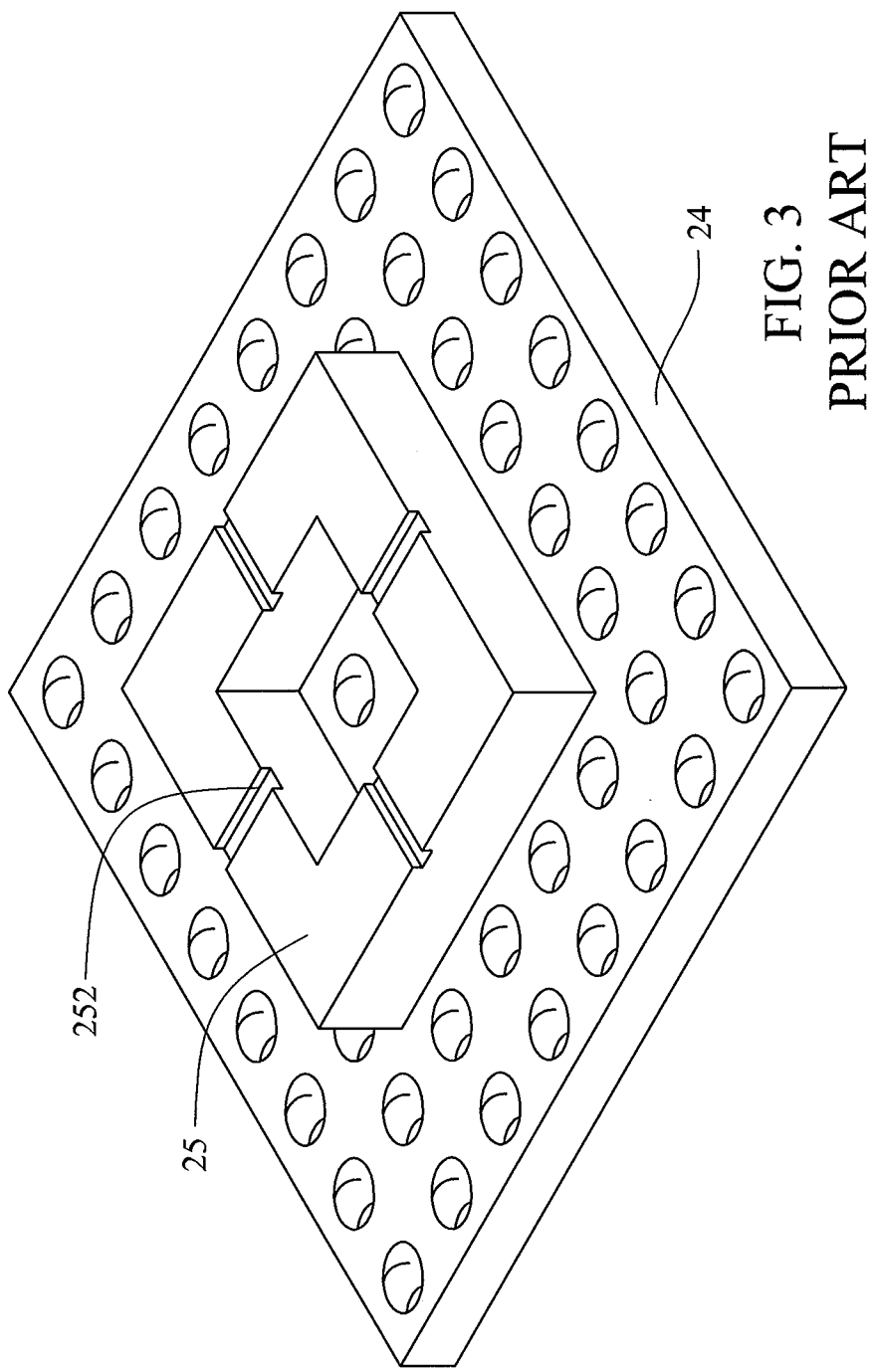
FIG. 3 illustrates a buffer block located on a space transformer of a probing device according to Prior Art 3.
Figure 4:
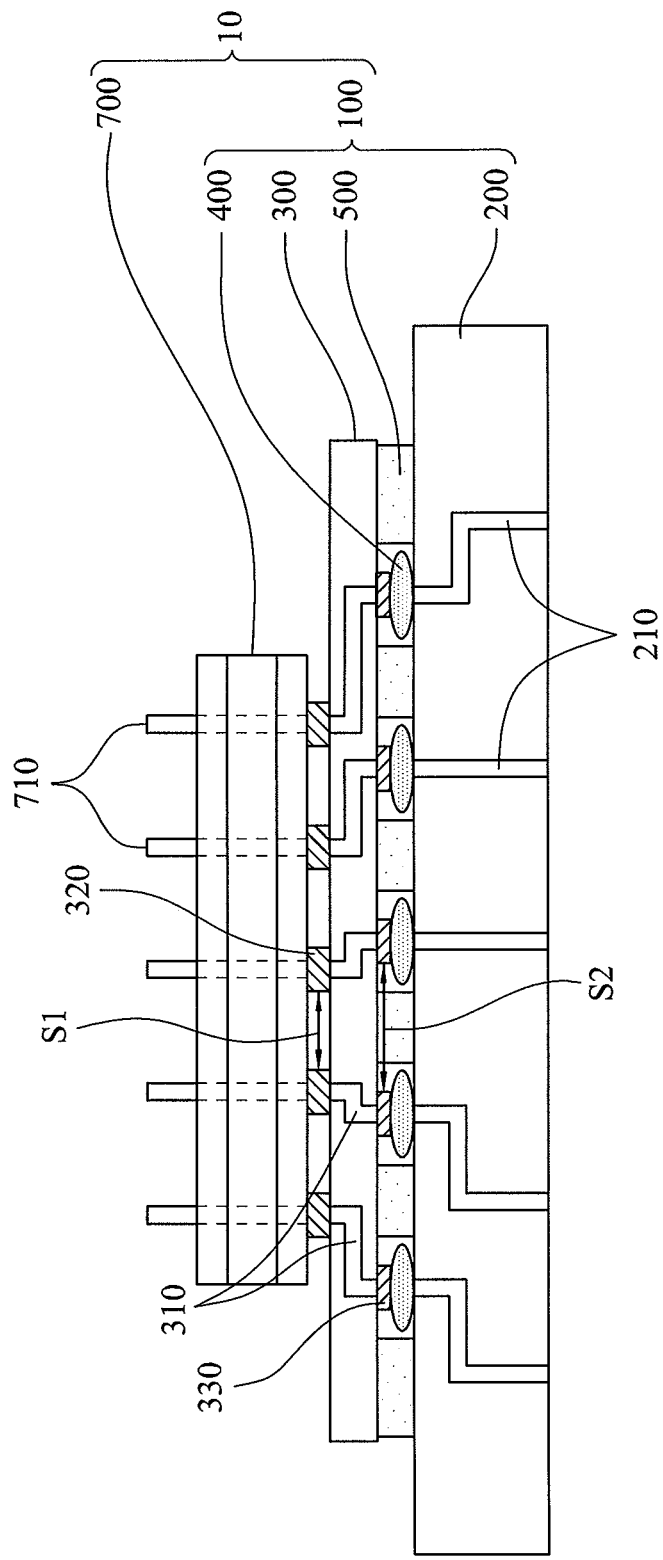
FIG. 4 is a schematic view illustrating a support structure used in a probing device in accordance with a first embodiment of the present invention.
Figure 5:
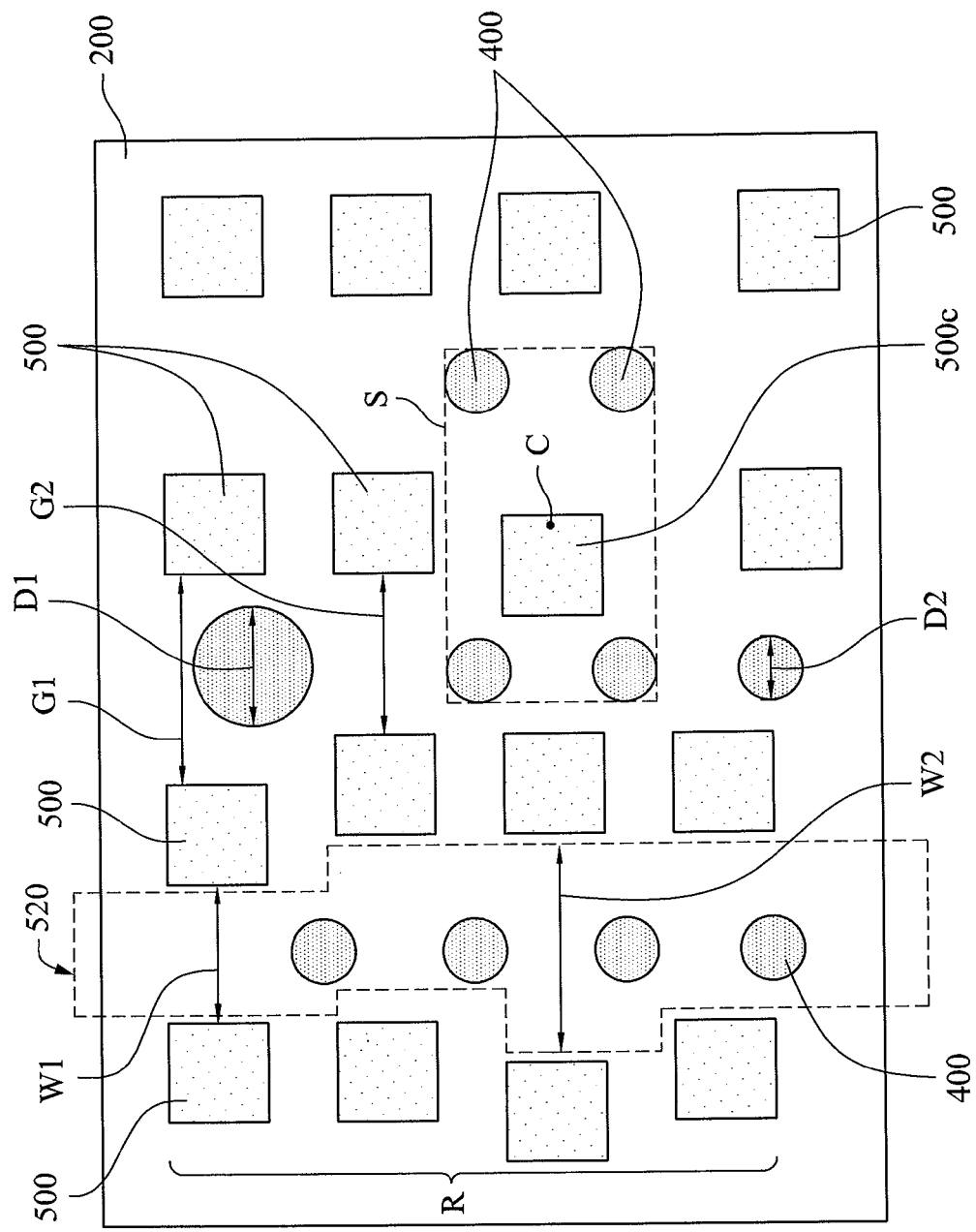
FIG. 5 is a schematic top view of the substrate shown in FIG. 4.

Referring to FIG. 4, a support structure 100 used in a probing device 10 in accordance with a first embodiment of the present invention is schematically shown. FIG. 5 is a schematic top view of the substrate 200 shown in FIG. 4. As illustrated in FIGS. 4 and 5, the probing device 10 comprises a support structure 100, and at least one probe module 700. As illustrated in FIG. 4, the support structure 100 is used in the probing device 10, comprising a substrate 200, a thin carrier 300 (in this embodiment, the carrier 300 is a space transformer 300), a plurality of solder balls 400, and a plurality of photoresist support blocks 500. The method for making the support structure 100 includes step a) and step b). Step a) is to provide the aforesaid substrate 200, carrier 300, solder balls 400 and photoresist support blocks 500 in a specific way. Step b) is to solder the carrier 300 and the substrate 200 with the solder balls 400 by a process of reflow soldering. The method for making the support structure 100 and the support structure 100 thus obtained will be described hereinafter in detail.

The substrate 200 is provided at an inside thereof with a plurality of first internal conductive lines 210. The space transformer 300 is provided at an inside thereof with a plurality of second internal conductive lines 310, and further has a plurality of first conductive contact pads 320, and a plurality of second conductive contact pads 330. The first conductive contact pads 320 are separately arranged a first surface of the space transformer 300 that faces toward the probe module 700. The second conductive contact pads 330 are separately arranged on an opposite second surface of the space transformer 300 that faces toward the substrate 200. The second internal conductive lines 310 are embedded inside the space transformer 300 with respective two opposite ends thereof respectively electrically connected to the respective first conductive contact pads 320 and the respective second conductive contact pads 330. The interval S1 between each two adjacent first conductive contact pads 320 is smaller than the interval S2 between each two adjacent second conductive contact pads 330. The solder balls 400 are separately arranged between the substrate 200 and the space transformer 300, and respectively electrically connected with the first internal conductive lines 210 and respectively electrically connected with the second internal conductive lines 310 through the respective second conductive contact pads 330. After reflow soldering in step b), the first internal conductive lines 210 are respectively electrically connected with the second internal conductive lines 310. The photoresist support blocks 500 are directly pre-formed on the substrate 200 or the space transformer 300 subject to actual demand. Preferably, the photoresist support blocks 500 are directly pre-formed on the space transformer 300; however, it is not a limitation to the claim scope of the present invention. Thus, the photoresist support blocks 500 are arranged between the substrate 200 and the space transformer 300 and spaced from one another, i.e., the photoresist support blocks 500 are independently separated from one another. Thus, waste gas produced during soldering of the solder balls 400 can be discharged without the need of gas guiding grooves as provided and seen in the prior arts. Further, at least one photoresist support block 500 may be provided between each two adjacent solder balls 400. However, it is within the scope of the present invention as long as at least one of the photoresist support blocks 500 is located between two adjacent solder balls 400. It is to be noted that the photoresist support blocks 500 are electrically insulated photoresist support blocks. Further, it is the optimal design that the interval between any two adjacent solder balls 400, between which at least one photoresist support block 500 is arranged, should not be less than 20 μm. The so-called "interval in the present invention means the shortest distance between two adjacent solder balls 400.

The probe module 700 is mounted to one surface of the space transformer 300 of the support structure 100 that faces toward the device under test (not shown). The probe module 700 comprises a plurality of probes 710. The probes 710 have the one ends thereof contacting the first conductive contact pads 320 respectively. Through the first conductive contact pads 320, the probes 710 are respectively electrically connected with the second internal conductive lines 310, the second conductive contact pads 330, the solder balls 400 and the first internal conductive lines 210. The respective other ends of the probes 710 are adapted for contacting the device under test.

As described above, the solder balls 400 and the photoresist support blocks 500 are arranged between the substrate 200 and the space transformer 300 in a staggered manner, thus, when the probes 710 of the probe module 700 contact the device under test, the solder balls 400 and the photoresist support blocks 500 support the space transformer 300 to bear the reaction force that is fed back by the device under test, preventing deformation of the space transformer 300, and thus, the lifespan of the space transformer 300 is greatly prolonged.

In this first embodiment, as shown in FIG. 4, every photoresist support block 500 is sandwichedly secured between and kept in direct contact with the substrate 200 and the space transformer 300. Every photoresist support block 500 is kept apart from every solder ball 400 at a distance, preventing the photoresist support blocks 500 from interfering with the soldering between the solder balls 400 and the first internal conductive lines 210 and second internal conductive lines 310. It is to be noted that the distance between every photoresist support block 500 and every solder ball 400 can be designed subject to actual demand as long as the photoresist support blocks 500 are kept apart from the solder balls 400. Keeping the photoresist support blocks 500 away from the solder balls 400 at a distance is to avoid interference with signal transmission and to maintain structural integrity of the solder balls 400. Further, letting the photoresist support blocks 500 touch the solder balls 400 may cause solder leaking, leading to series connection of other two unrelated signals.

Further, the space transformer 300 in the present invention is configured having a multi-layered organic (MLO) structure. The space transformer 300 may be, but not limited to, a carrier for packaging an integrated circuit chip, which usually has a thickness less than 2 mm, or normally, in the range within 0.05 mm to 1 mm. That is to say, the space transformer 300 may be a carrier provided by an IC manufacturer or IC designer for packaging an integrated circuit chip. The solder balls 400 generally refer to the tin paste, tin balls, or other related structures. However, this is not a limitation to the present invention. In this embodiment, the substrate 200 is a printed circuit board; however, it is not limited thereto. In other embodiments, the substrate 200 may be a multi-layered ceramic (MLC) structure, or a combination of a multi-layered ceramic structure and a multi-layered organic structure (MLOC) electrically bonded together by pre-reflow soldering.

It is to be noted that the photoresist support blocks 500 are directly pre-formed of a photoresist on the substrate 200 or the space transformer 300 by lithography. More specifically, the photoresist support blocks 500 are directly pre-formed on the surface of the carrier 300 that faces toward the substrate 200, or on the surface of the substrate 200 that faces toward the carrier 300. More precisely, the photoresist support blocks 500 may be formed by repeatedly depositing photoresist on the substrate 200 or the space transformer 300 to form a photoresist layer having a suitable thickness, and then patterning the photoresist layer to form the desired independent photoresist support blocks 500 on the substrate 200 or the space transformer 300. By this way, the photoresist support blocks 500 are directly pre-formed on the substrate 200 or the transformer 300.

Because the photoresist support blocks 500 are made by lithography, they can be formed on the substrate 200 or the space transformer 300 subject to any desired pattern. This means that a non-linear arrangement can be provided without the need of machining the thin space transformer 300. Because the photoresist support blocks 500 are arranged separately, waste gas produced during soldering of the solder balls 400 can be discharged without the need of creating gas guiding grooves as seen in the prior arts. Because the present invention can overcome the drawbacks of the prior arts, the photoresist support blocks 500 can be freely arranged among multiple solder balls 400 in a periodic or aperiodic manner (see FIG. 5).

For example, if an IC package carrier provided by an IC manufacturer or IC designer is used for the space transformer 300, the designer can utilize the known information of the allocation of the solder balls 400 on the space transformer 300 to make the photoresist support blocks 500 on the space transformer 300 or the substrate 200 in a staggered manner beyond the locations of the solder balls 400, keeping the photoresist support blocks 500 away from the solder balls 400 without touching any of the solder balls 400.

Embodiment II

Figure 6:
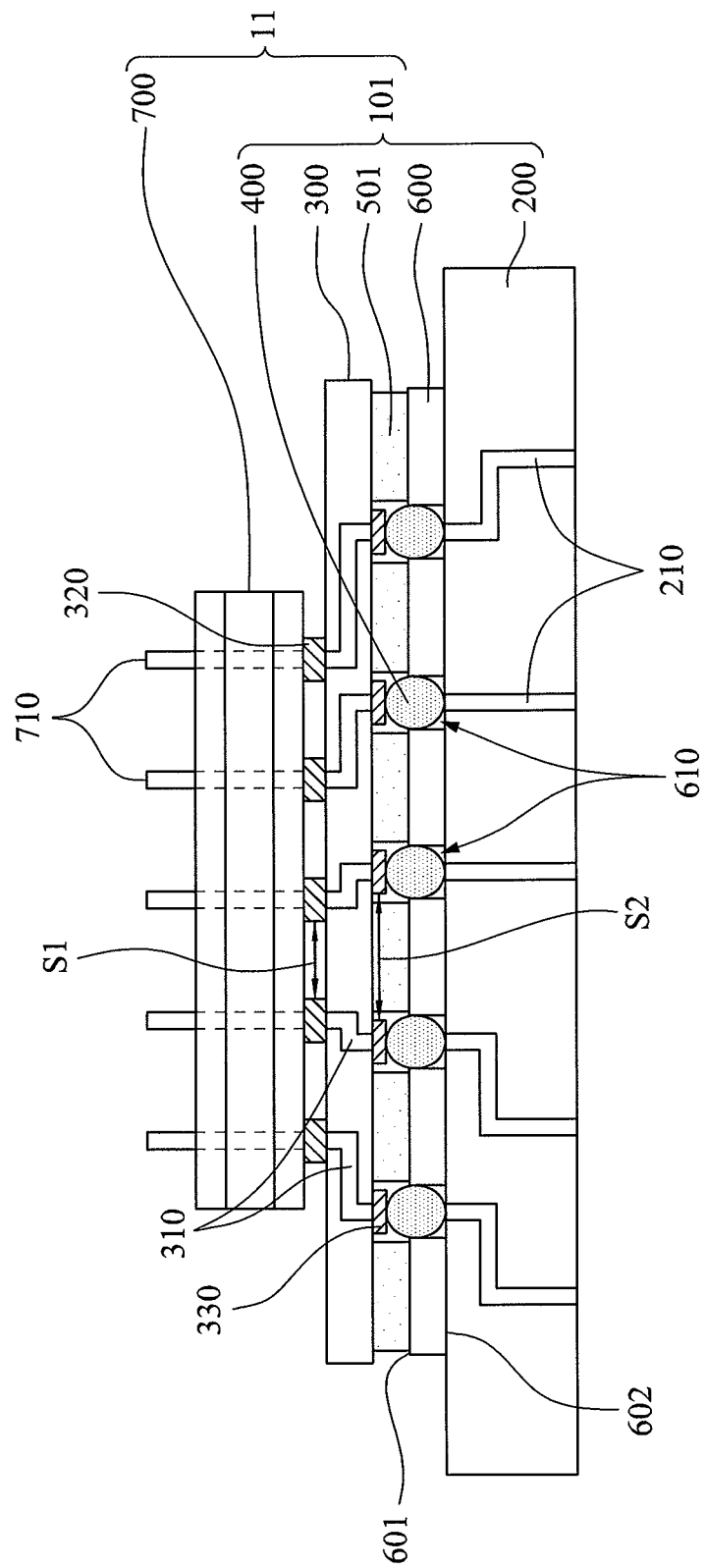
FIG. 6 is a schematic view illustrating a support structure used in a probing device in accordance with a second embodiment of the present invention.

Referring to FIG. 6, a support structure 101 used in a probing device 11 in accordance with a second embodiment of the present invention is shown. As illustrated in FIG. 6, the support structure 101 in accordance with this second embodiment is substantially similar to the support structure 100 of the aforesaid first embodiment with the exception that the support structure 101 of this second embodiment further comprises a reinforcing board 600. In the fabrication of the support structure 101, the step a) further provides a substep of providing this reinforcing board 600, and setting it in between the substrate 200 and the space transformer 300. The reinforcing board 600 has a first surface 601 facing toward the space transformer 300, and an opposing second surface 602 facing toward the substrate 200. The reinforcing board 600 may be, but not limited to, an aluminum oxide board or silicon nitride board. The reinforcing board 600 is adapted to enhance the overall structural strength of the support structure 101. Further, because the reinforcing board 600 is an independent structure, it can be pre-made.

The reinforcing board 600 has a plurality of through holes 610. The through holes 610 are separately arranged in the reinforcing board 600 corresponding in location to the solder balls 400, and respectively accommodate the solder balls 400 therein. In this second embodiment, the photoresist support blocks 501 are pre-formed on the first surface 601 of the reinforcing board 600, namely on the surface of the reinforcing board 600 that faces toward the space transformer 300; therefore, every photoresist support block 501 is disposed between the space transformer 300 and the reinforcing board 600, and kept in contact with them. However, this design is not a limitation to the present invention. Alternately, the photoresist support blocks 501 can be pre-formed on the surface of the space transformer 300 that faces toward the reinforcing board 600. In this second embodiment, the substrate 200, the space transformer 300, the solder balls 400, the photoresist support blocks 501, the support structure 101 and the probe module 700 are identical to like parts in the aforesaid first embodiment.

Embodiment III

Figure 7:
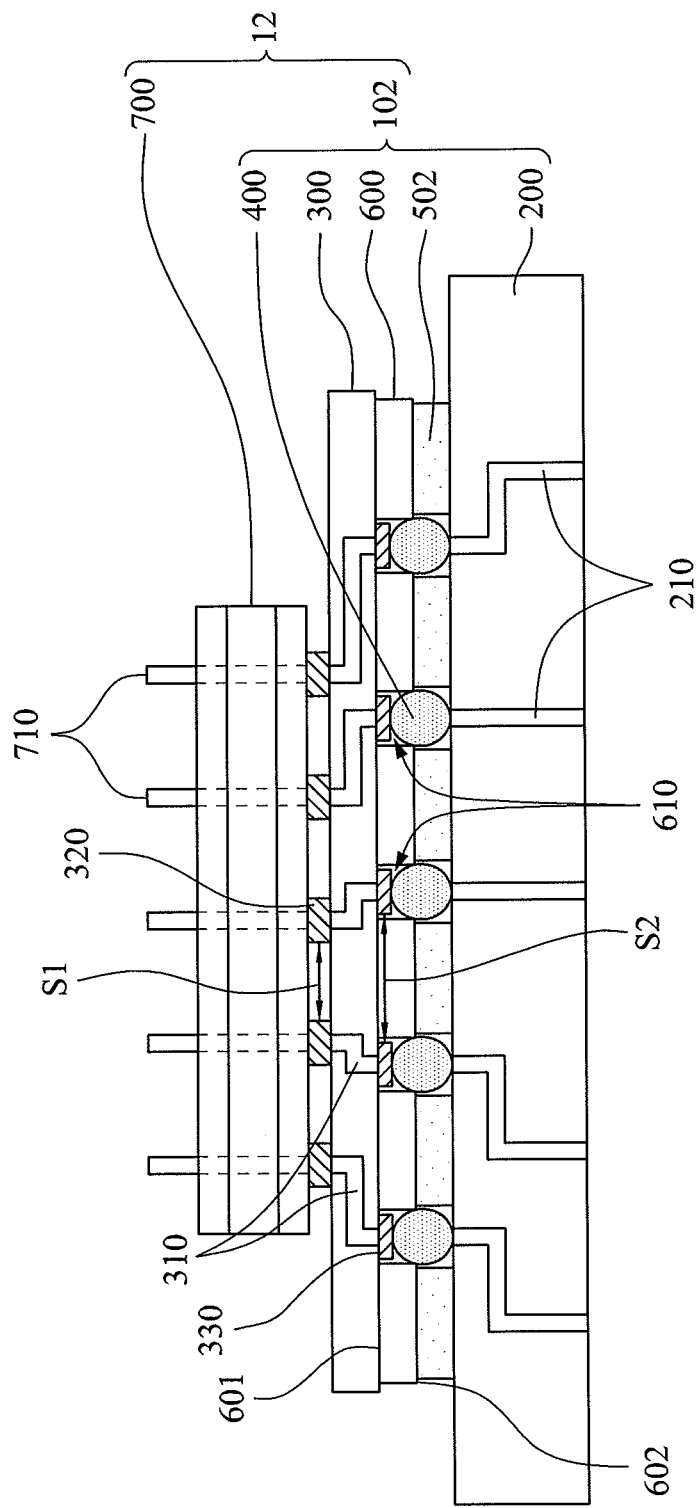
FIG. 7 is a schematic view illustrating a support structure used in a probing device in accordance with a third embodiment of the present invention.

Referring to FIG. 7, a support structure 102 used in a probing device 12 in accordance with a third embodiment of the present invention is shown. As illustrated in FIG. 7, the support structure 102 in accordance with this third embodiment is substantially similar to the support structure 101 of the aforesaid second embodiment with the exception that the photoresist support blocks 502 in accordance with this third embodiment are directly pre-formed on the second surface 602 of the reinforcing board 600, namely on the surface of the reinforcing board 600 facing toward the substrate 200, and therefore, every photoresist support block 502 is disposed between the substrate 200 and the reinforcing board 600, and kept in contact with them. However, this design is not a limitation to the present invention. Alternately, the photoresist support blocks 501 can be pre-formed on the surface of the substrate 200 that faces toward the second surface 602 of the reinforcing board 600. In this third embodiment, the substrate 200, the space transformer 300, the solder balls 400, the photoresist support blocks 502, the support structure 102 and the probe module 700 are identical to like parts in the aforesaid first or second embodiment.

FIGS. 8A-8F illustrate various alternate forms of the photoresist support blocks of the support structure for being used in a probing device. Because the photoresist support blocks are made by lithography, the shape, size, interval, location and pattern arrangement of the photoresist support blocks can be controlled as expected. It is to be noted that the photoresist support blocks described hereinafter can be used in any of the above-described three embodiments.

Figure 8C:
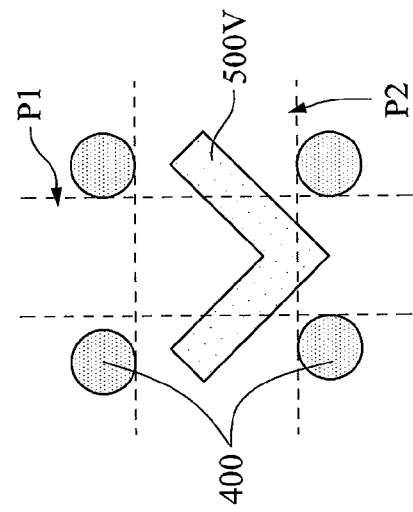
Figure 8B:
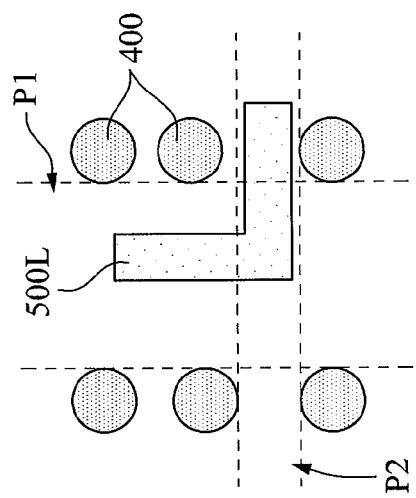
Figure 8A:
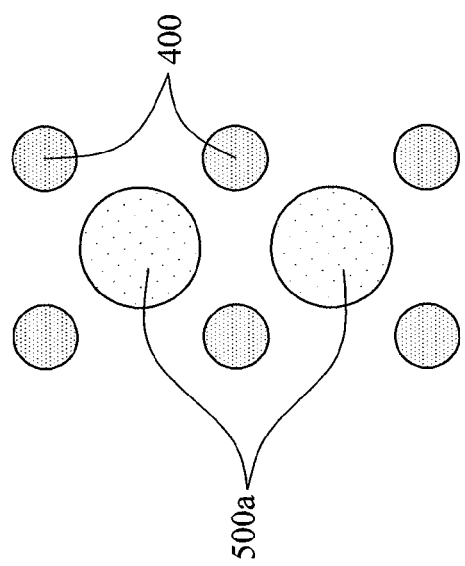

With respect to the shape of the photoresist support blocks, the photoresist support blocks can be designed in the form of any geometric shape, such as, but not limited to, rectangular column-shaped photoresist support blocks 500 shown in FIG. 5, cylindrical column-shaped photoresist support blocks 500a shown in FIG. 8A, L-shaped photoresist support blocks 500L shown in FIG. 8B, V-shaped photoresist support blocks 500V shown in FIG. 8C, U-shaped photoresist support blocks 500U shown in FIG. 8D, or Y-shaped photoresist support blocks 500Y shown in FIG. 8E.

The shape of the photoresist support blocks can be extended to the left and right sides, or top and bottom sides, of any solder ball 400. More specifically, if the solder balls 400 can define two paths P1, P2 that perpendicularly intersect with each other, the photoresist support blocks can be simultaneously located in the paths P1, P2. For example, the L-shaped photoresist support blocks 500L shown in FIG. 8B, the V-shaped photoresist support blocks 500V shown in FIG. 8C, the U-shaped photoresist support blocks 500U shown in FIG. 8D, or the Y-shaped photoresist support blocks 500Y shown in FIG. 8E have parts located in the paths P1, P2, respectively.

In order to enhance the effect of a larger area of support and to reduce the risk of deformation of the space transformer 300, it is most preferably to maximize the size of the photoresist support blocks 500b between any two adjacent solder balls 400, as shown in FIG. 8F. For example, the photoresist support block 500b may occupy $4/5$ or more of the space between two adjacent solder balls 400. To this end, the photoresist support blocks may be made in the form of a reuleaux curved-edge squad 510. The reuleaux curved-edge squad 510 has four vertices 511, four curved edges 512 each connected between two adjacent vertices 511. This kind of photoresist support block may be arranged in a way that each curved edge 512 faces toward one respective solder ball 400, such that each curved edge 512 is disposed in proximity to one respective solder ball 400 without physically contacting the solder ball 400.

With respect to the size of the photoresist support blocks, as illustrated in FIG. 5, all the photoresist support blocks 500 have the same area. More specifically, the side of each photoresist support block 500 facing toward the space transformer 300 or the substrate 200 has the same area. However, this design is not a limitation to the present invention. Alternately, the surfaces of the photoresist support blocks 500 facing toward the space transformer 300 or substrate 200 may be made in at least two different areas.

With respect to the interval between two adjacent photoresist support blocks 500, as shown in FIG. 5, the interval between each two adjacent photoresist support blocks 500 can be different. More specifically, at least two different intervals G1, G2 are defined between the photoresist support blocks 500.

With respect to the locations of the photoresist support blocks, as shown in FIG. 5, the photoresist support blocks 500 are respectively disposed between any two adjacent solder balls 400 that can be longitudinally or transversely arranged in line, or, more particularly, the photoresist support blocks 500c can be disposed between two adjacent solder balls 400 that are obliquely arranged in line. More specifically speaking, when any four adjacent solder balls 400 define an imaginary quadrilateral S, the photoresist support block 500c may be located or approximately located in a centroid C of the imaginary quadrilateral S. Further, because the photoresist support blocks are used to support and enable the space transform 300 having a thin thickness to resist the reaction force transmitted from the DUT through the probes 710 of the probe module 700, the photoresist support blocks shall be distributed at least in a region corresponding to the distributed region of the probes 710 of the probe module 700, or preferably at a region corresponding to the location of the probe module 700, or more preferably at a region substantially corresponding to the whole area of the space transformer 300. For example, as shown in FIG. 4, the photoresist support blocks 500 are distributed between the space transformer 300 and the substrate 200 in a region not only corresponding to the location of the probe module 700 but also covering almost the whole area of the space transformer 300. By this design, the photoresist support blocks 500 can provide a full support to the space transformer 300 for preventing the space transformer 300 from being deformed when the space transformer 300 receives the reaction force.

With respect to the pattern arrangement of the photoresist support blocks, as shown in FIG. 5, the photoresist support blocks 500 can be arranged in an array or approximately like an array, or any other suitable arrangement. More specifically, the photoresist support blocks can be arranged in a multi-row pattern. In the multi-row pattern, there are multiple rows R (for example, 4 rows). Any two adjacent rows define therebetween a gas guiding path 520. Because the photoresist support blocks 500 are separately arranged, the gas guiding paths 520 can extend in the longitudinal direction, in the transverse direction, or in a non-linear direction, having the solder balls 400 located therein. Thus, when the solder balls 400 are soldered, waste gas thus produced can be discharged to the outside. Because the photoresist support blocks 500 are made by lithography, the photoresist support blocks 500 that define the gas guiding paths 520 need not to be located on one same straight line. Therefore, the gas guiding paths 520 can be configured to extend in a non-linear manner, or, the gas guiding paths 520 can configured having two different widths W1, W2. However, it is to be noted that the present invention is not limited to aforesaid arrangement.

Further, because the photoresist support blocks 500 are made by lithography, if the solder balls 400 of two different diameters D1, D2 are arranged in one same gas guiding path 520, the arrangement of the photoresist support blocks 500 can be easily designed to keep away from the solder balls 400 having different sizes.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A method for making a support structure for a probing device, comprising the steps of:
   a) providing a substrate having a plurality of first internal conductive lines, a carrier having a plurality of second internal conductive lines and a thickness less than 2 mm for packaging an integrated circuit chip, a plurality of photoresist support blocks made by lithography, and a plurality of solder balls in a way that the photoresist support blocks and the solder balls are disposed between the substrate and the carrier, the photoresist support blocks are separately arranged, and at least one of the photoresist support blocks is disposed between two adjacent said solder balls; and
   b) soldering the carrier and the substrate with the solder balls by reflow soldering to electrically connect the first internal conductive lines with the second internal conductive lines respectively;
   wherein the carrier is a space transformer having a first surface, a second surface that is opposite to the first surface and faces toward the substrate, a plurality of first conductive contact pads separately arranged on the first surface, and a plurality of second conductive contact pads separately arranged on the second surface and electrically connected with said plurality of first conductive contact pads through said plurality of second internal conductive lines, respectively; two adjacent said first conductive contact pads define a first interval that is smaller than a second interval defined by two adjacent said second conductive contact pads;
   wherein a plurality of intervals are defined between two adjacent said photoresist support blocks, and the intervals include at least two different lengths; and
   wherein said plurality of photoresist support blocks are arranged in a pattern having multiple rows; any two adjacent rows of the photoresist support blocks in the pattern define a gas guiding path in which one or more of the solder balls are located; at least one of the gas guiding paths has at least two different widths.

2. The method as claimed in claim 1, wherein the at least one of the photoresist support blocks is disposed between two adjacent said solder balls in a way that the two adjacent said solder balls define therebetween an interval larger than 20 µm.

3. The method as claimed in claim 1, wherein the photoresist support blocks have a shape of cylindrical column or rectangular column.

4. The method as claimed in claim 1, wherein the surfaces of the photoresist support blocks that face toward the carrier or the substrate have at least two different areas.

5. The method as claimed in claim 1, wherein the substrate is selected from the group consisting of a printed circuit board, a board having a multi-layered ceramic structure, and a board having a multi-layered ceramic structure and a multi-layered organic structure.

6. The method as claimed in claim 1, wherein the step a) further comprises a substep of providing a reinforcing board and disposing the reinforcing board between the substrate and the carrier; the reinforcing board has a plurality of through holes that accommodate the solder balls respectively.

7. The method as claimed in claim 6, wherein the photoresist support blocks are directly pre-formed on a first surface or a second surface of the reinforcing board; the first surface of the reinforcing board faces toward the carrier, and the second surface of the reinforcing board faces toward the substrate.

8. The method as claimed in claim 1, wherein the photoresist support blocks are directly pre-formed on a surface of the carrier or a surface of the substrate; the surface of the carrier faces toward the substrate, and the surface of the substrate faces toward the carrier.

9. The method as claimed in claim 1, wherein the photoresist support blocks are arranged among the solder balls in an aperiodic manner.

10. The method as claimed in claim 1, wherein at least one of the gas guiding paths extends in a non-linear manner.

11. The method as claimed in claim 1, wherein the solder balls that are located in one of the gas guiding paths have at least two different diameters.

12. The method as claimed in claim 1, wherein four adjacent said solder balls define an imaginary quadrilateral; at least one of the photoresist support blocks is located in a centroid of the imaginary quadrilateral.

13. The method as claimed in claim 12, wherein the at least one of the photoresist support blocks that is located in the centroid of the imaginary quadrilateral is a reuleaux curved-edge squad having four vertices and four curved edges each connected between two adjacent said vertices; each said curved edge faces toward one respective said solder ball.

14. The method as claimed in claim 1, wherein at least one of the photoresist support blocks has an L-shaped, V-shaped, U-shaped or Y-shaped profile.

15. The method as claim in claim 1, wherein a probe module is disposed on the first surface of the space transformer; the photoresist support blocks are separately arranged at least in a region corresponding to the probe module.

* * * * *